United States Patent
Kal et al.

(10) Patent No.: US 10,971,372 B2
(45) Date of Patent: Apr. 6, 2021

(54) GAS PHASE ETCH WITH CONTROLLABLE ETCH SELECTIVITY OF SI-CONTAINING ARC OR SILICON OXYNITRIDE TO DIFFERENT FILMS OR MASKS

(71) Applicant: Tokyo Electron Limited, Tokyo (JP)

(72) Inventors: Subhadeep Kal, Albany, NY (US); Nihar Mohanty, Clifton Park, NY (US); Angelique D. Raley, Mechanicville, NY (US); Aelan Mosden, Poughkeepsie, NY (US); Scott W. Lefevre, Ballston Spa, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 355 days.

(21) Appl. No.: 15/191,956

(22) Filed: Jun. 24, 2016

(65) Prior Publication Data
US 2016/0379842 A1     Dec. 29, 2016

Related U.S. Application Data

(60) Provisional application No. 62/185,150, filed on Jun. 26, 2015.

(51) Int. Cl.
  *H01L 21/311* (2006.01)
  *H01L 21/67* (2006.01)

(52) U.S. Cl.
  CPC .. *H01L 21/31116* (2013.01); *H01L 21/67069* (2013.01); *H01L 21/67109* (2013.01); *H01L 21/67248* (2013.01)

(58) Field of Classification Search
  CPC ......... H01L 21/31116; H01L 21/67248; H01L 21/67109; H01L 21/67069; H01L 21/0274; H01L 21/32135
  See application file for complete search history.

(56) References Cited

U.S. PATENT DOCUMENTS

| | | |
|---|---|---|
| 3,863,049 A | 1/1975 | Hinman |
| 4,331,485 A | 5/1982 | Gat |

(Continued)

FOREIGN PATENT DOCUMENTS

| | | |
|---|---|---|
| CN | 101454876 A | 6/2009 |
| CN | 101473419 A | 7/2009 |

(Continued)

OTHER PUBLICATIONS

Publication by Khairudin "The Fabrication of High Aspect Ratio Nanostructures on Quartz Substrate" (Chapetr 9, pp. 211-225) of a book titled "Nanotechnology and Nanomaterials, Updates in Advanced Lithography", published by Intech, (2013) found in web site: (http://www.intechopen.com/books/updates-in-advancedlithography).*

(Continued)

*Primary Examiner* — Nadine G Norton
*Assistant Examiner* — Mahmoud Dahimene
(74) *Attorney, Agent, or Firm* — Rothwell, Figg, Ernst & Manbeck, P.C.

(57) ABSTRACT

A method for the dry removal of a material on a microelectronic workpiece is described. The method includes receiving a workpiece having a surface exposing a target layer composed of silicon and either (1) organic material or (2) both oxygen and nitrogen, and selectively removing at least a portion of the target layer from the workpiece. The selective removal includes exposing the surface of the workpiece to a chemical environment containing N, H, and F at a first setpoint temperature to chemically alter a surface region of the target layer, and then, elevating the temperature of the workpiece to a second setpoint temperature to remove the chemically treated surface region of the target layer.

17 Claims, 2 Drawing Sheets

(56) References Cited

U.S. PATENT DOCUMENTS

| | | | |
|---|---|---|---|
| 4,645,218 | A | 2/1987 | Ooshio et al. |
| 4,680,086 | A | 7/1987 | Thomas et al. |
| 4,913,790 | A | 4/1990 | Narita et al. |
| 4,992,391 | A | 2/1991 | Wang |
| 5,059,770 | A | 10/1991 | Mahawili |
| 5,151,871 | A | 9/1992 | Matsumura et al. |
| 5,174,856 | A | 12/1992 | Hwang et al. |
| 5,192,849 | A | 3/1993 | Moslehi |
| 5,219,485 | A | 6/1993 | Wang et al. |
| 5,226,056 | A | 7/1993 | Kikuchi et al. |
| 5,242,536 | A | 9/1993 | Schoenborn |
| 5,316,616 | A | 5/1994 | Nakamura et al. |
| 5,393,374 | A | 2/1995 | Sato et al. |
| 5,446,824 | A | 8/1995 | Moslehi |
| 5,605,600 | A | 2/1997 | Muller et al. |
| 5,628,871 | A | 5/1997 | Shinagawa |
| 5,711,849 | A | 1/1998 | Flamm et al. |
| 5,746,928 | A | 5/1998 | Yen et al. |
| 5,876,119 | A | 3/1999 | Ishikawa et al. |
| 5,883,778 | A | 3/1999 | Sherstinsky et al. |
| 5,892,207 | A | 4/1999 | Kawamura et al. |
| 5,981,913 | A | 11/1999 | Kadomura et al. |
| 6,063,710 | A | 5/2000 | Kadomura et al. |
| 6,235,563 | B1 | 5/2001 | Oka et al. |
| 6,555,397 | B1 * | 4/2003 | Bonser ............ H01L 21/28123 257/E21.206 |
| 8,021,514 | B2 * | 9/2011 | Fu ..................... C23C 16/0245 156/345.33 |
| 8,202,803 | B2 | 6/2012 | Feurprier et al. |
| 8,501,629 | B2 * | 8/2013 | Tang ................ H01J 37/32357 216/22 |
| 8,715,455 | B2 | 5/2014 | Brcka |
| 2010/0024981 | A1 | 2/2010 | Wallace et al. |
| 2013/0026133 | A1 | 1/2013 | Engelmann et al. |
| 2013/0214360 | A1 | 8/2013 | Siprak |
| 2014/0303818 | A1 | 10/2014 | Wang et al. |
| 2014/0308818 | A1 * | 10/2014 | Wang ..................... B44C 1/22 438/723 |
| 2015/0118857 | A1 | 4/2015 | Liu et al. |
| 2015/0176928 | A1 * | 6/2015 | Tabuchi ............ G05D 23/1393 165/96 |

FOREIGN PATENT DOCUMENTS

| | | |
|---|---|---|
| CN | 101205312 A | 6/2011 |
| CN | 102687249 A | 9/2012 |
| CN | 103748666 A | 4/2014 |
| CN | 103765562 A | 4/2014 |
| EP | 0 272 140 A2 | 6/1988 |
| EP | 0 399 676 A1 | 11/1990 |
| EP | 0 601 788 A2 | 6/1994 |
| EP | 0 665 575 A1 | 8/1995 |
| JP | 3-145123 A | 6/1991 |
| JP | 3-196206 A | 8/1991 |
| JP | 5-136095 A | 6/1993 |
| JP | 5-243191 A | 9/1993 |
| JP | 8-191059 A | 7/1996 |
| JP | WO 2014014127 * | 1/2014 |
| JP | 2015-46564 A | 3/2015 |
| TW | 200845190 | 11/2008 |
| TW | 201126605 A1 | 8/2011 |
| WO | 2008076663 A1 | 6/2008 |

OTHER PUBLICATIONS

Tabuchi (WO 2014014127A1 [Published Jan. 23, 2014] for which Tabuchi (US 2015/0176928) is Used as a translation)(Tramslated Abstract).*

International Search Report and Written Opinion dated Oct. 11, 2016 in PCT/US2016/039316 (11 pages).

Office Action dated Feb. 16, 2017 in corresponding Taiwan Patent Application No. 105119867 (with an English translation) (17 pages).

Flamm, US RE40,264 E, Date of Reissued Patent on Apr. 29, 2008, U.S. Appl. No. 10/439,245, filed May 14, 2003.

Anderson, H1145, Published on Mar. 2, 1993, Application No. 790,098, filed Nov. 6, 1991.

The American Heritage College Dictionary, Third Edition 1993, Definition of "portion" (3 pages).

Coburn et al, "Plasma etching—A discussion of mechanisms," Journal of Vacuum Science and Technology, 16(2), Mar./Apr. 1979, American Vacuum Society (13 pages).

Fischl et al., "Etching of Tungsten and Tungsten Silicide Films by Chlorine Atoms" Aug. 1988 by The Journal of Electrochemical Society in vol. 135, No. 8 (4 pages).

Flamm et al., "Plasma Etching Technology—An Overview" in Plasma Etching, An Introduction, Edited by Dennis M. Manos and Daniel L. Flamm, Academic Press, Inc., San Diego, 1989 (5 pages).

Glenn P. Forney, "Computing Radiative Heat Transfer Occurring in a Zone Fire Model," Fire Science & Technology vol. 14 No. 1 & No. 2 (31-37) 1994 (17 pages).

Igarashi et al, "Sub-quarter Micron Copper Interconnects through Dry Etching Process and its Reliability" Symposium on VLSI Technology Digest of Technical Papers (1994) (2 pages).

Incropera et al., "Fundamentals of Heat and Mass Transfer" Third Edition, John Wiley & Sons., Inc. 1981 (92 pages).

David R. Lide, "CRC Handbook of Chemistry and Physics: A Ready-Reference Book of Chemical and Physical Data 71st Edition," CRC Press Inc., 1974 (9 pages).

Liu et al., "Heat transfer and flow structures in an excited circular impinging jet," Int. J. Heat Mass Transfer. vol. 39, No. 17, pp. 3695-3706 (1996) (12 pages).

Lance Edward Rewerts, "The effect of liquid inundation, vapor shear, and non-condensible gases on the condensation of refrigerants HFC-134a and HCFC-123," Iowa State University (1994) (226 page).

Sharp et al, "Turbulent Heat Transfer Investigation: Turbulence Length Scales and Turbine Heat Transfer." WL-TR-96-2091 Wright Laboratory (1996) (54 pages).

Shortley et al, "Elements of Physics for Students of Science and Engineering" Third Edition, Prentice-Hall, Inc., New Jersey, 1961 (5 pages).

Jasbir Singh, "Heat Transfer Fluids and Systems for Process and Energy Applications" Marcel Dekker, Inc., New York and Basel, 1985 (15 pages).

Wright et al., "A Closed-Loop Temperature Control System for a Low-Temperature Etch Chuck," Advanced Techniques for Integrated Circuit Processing II, vol. 1803 (1992) SPIE—The International Society for Optical Engineering (12 pages).

Office Action for CN 201680045009.1 dated Nov. 23, 2020 (8 pages).

* cited by examiner

GAS PHASE ETCH WITH CONTROLLABLE ETCH SELECTIVITY OF SI-CONTAINING ARC OR SILICON OXYNITRIDE TO DIFFERENT FILMS OR MASKS

FIELD OF INVENTION

The invention relates to a dry non-plasma treatment system and method for treating a substrate, and more particularly to a dry non-plasma treatment system and method for chemical and thermal treatment of a substrate.

DESCRIPTION OF RELATED ART

The need to remain competitive in cost and performance in the production of semiconductor devices elevates demand to continually increase the device density of integrated circuits. And, to achieve higher degrees of integration with the miniaturization in semiconductor integrated circuitry, robust methodologies are required to reduce the scale of the circuit pattern formed on the semiconductor substrate. These trends and requirements impose ever-increasing challenges on the ability to transfer the circuit pattern from one layer to another layer.

Photolithography is a mainstay technique used to manufacture semiconductor integrated circuitry by transferring geometric shapes and patterns on a mask to the surface of a semiconductor wafer. In principle, a light sensitive material is exposed to patterned light to alter its solubility in a developing solution. Once imaged and developed, the portion of the light sensitive material that is soluble in the developing chemistry is removed, and the circuit pattern remains.

Furthermore, to advance optical lithography, as well as accommodate the deficiencies thereof, continual strides are being made to establish alternative patterning strategies to equip the semiconductor manufacturing industry for sub-30 nm technology nodes. Optical Lithography (193i) in conjunction with multiple patterning, EUV (Extreme Ultraviolet) Lithography, and DSA (Direct Self Assembly) patterning are considered to be some of the promising candidates that are being evaluated to meet the rising demands for aggressive patterning. Accompanying the increasing complexity of both current and advanced patterning schemes, a host of materials are used that further impose an ever-increasing burden on etch selectivity and the ability to selectively remove one material relative to another.

Advanced patterning schemes utilize multi-layer masks of various compositions, whether it is to improve mask budget or prepare a mandrel for altering topography for multi-pattern formation. Such multi-layer masks include crystalline and amorphous silicon, amorphous carbon, silicon oxide ($SiO_x$), silicon nitride ($SiN_y$), silicon oxynitride ($SiO_xN_y$), silicon-containing anti-reflective coating (SiARC), among others. Depending on the process flow and patterning scheme, subsequent etch steps can be used to etch or remove one material relative to another. For example, it may be desirable to selectively remove SiARC or silicon oxynitride ($SiO_xN_y$) with respect to other materials/films, such as organic dielectric layers (ODL), crystalline and amorphous silicon, amorphous carbon, silicon dioxide ($SiO_x$), silicon nitride ($SiN_y$).

Current removal techniques include the application of a wet etch chemistry to the workpiece, which has inherent disadvantages due to the etch mechanism. Significant limitations of wet processes include poor etch selectivity of the material to be removed with respect to other materials present on the substrate, including silicon oxide ($SiO_x$) and silicon nitride ($SiN_y$), among others. In addition, wet processes suffer from pattern damage and defectivity, which constricts accurate (targeted), clean, and selective material etch. Furthermore, dry plasma processes have been explored. However, such processes induce pattern damage. Thus, it is imperative that new systems and processes are developed to enable clean, selective, targeted, and relatively fast removal of various materials used in patterning schemes, among other applications.

SUMMARY OF THE INVENTION

Embodiments of the invention relate to a dry non-plasma treatment system and method for treating a substrate, and more particularly to a dry non-plasma treatment system and method for chemical and thermal treatment of a substrate. Additional embodiments include selective, gas-phase, non-plasma etching of various materials.

According to one embodiment, a method for the dry removal of a material on a microelectronic workpiece is described. The method includes receiving a workpiece having a surface exposing a target layer to be at least partially removed, placing the workpiece on a workpiece holder in a dry, non-plasma etch chamber, and selectively removing at least a portion of the target layer from the workpiece. The selective removal includes operating the dry, non-plasma etch chamber to perform the following: exposing the surface of the workpiece to a chemical environment at a first setpoint temperature in the range of 35 degrees C. to 100 degrees C. to chemically alter a surface region of the target layer, and then, elevating the temperature of the workpiece to a second setpoint temperature at or above 100 degrees C. to remove the chemically treated surface region of the target layer.

According to another embodiment, a system for the dry removal of a material on a microelectronic workpiece. The system includes a process chamber for processing a workpiece in a non-plasma, vacuum environment, a workpiece holder arranged within the process chamber, and configured to support the workpiece, a temperature control system coupled to the workpiece holder, and configured to control the temperature of the workpiece holder at two or more setpoint temperatures, a gas distribution system coupled to the process chamber, and arranged to supply one or more process gases into the process chamber; and a controller operably coupled to the temperature control system, and configured to control the temperature of the workpiece holder at a first setpoint temperature in the range of 35 degrees C. to 100 degrees C., and adjust and control the temperature of the workpiece holder at a second setpoint temperature at or above 100 degrees C.

According to yet another embodiment, a method for the dry removal of a material on a microelectronic workpiece is described. The method includes receiving a workpiece having a surface exposing a target layer composed of silicon and either (1) organic material or (2) both oxygen and nitrogen, and selectively removing at least a portion of the target layer from the workpiece. The selective removal includes exposing the surface of the workpiece to a chemical environment containing N, H, and F at a first setpoint temperature to chemically alter a surface region of the target layer, and then, elevating the temperature of the workpiece to a second setpoint temperature to remove the chemically treated surface region of the target layer.

DETAILED DESCRIPTION OF SEVERAL EMBODIMENTS

Figure 1A:
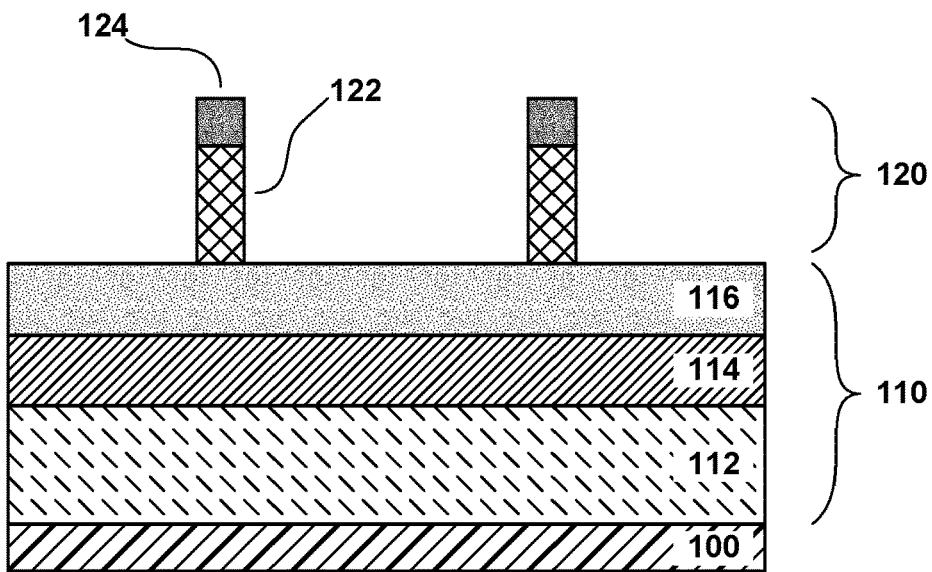
FIGS. 1A and 1B illustrate a method of dry removing a layer on a workpiece according to an embodiment.

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "radiation sensitive material" means and includes photosensitive materials such as photoresists.

As used herein, the term "non-plasma" generally means that plasma is not formed in the space proximate the workpiece being treated. While the products of plasma can be introduced from a remote location to the environment proximate the workpiece being treated, plasma is not actively generated by an electromagnetic field adjacent the workpiece.

"Workpiece" as used herein generically refers to the object being processed in accordance with the invention. The workpiece may include any material portion or structure of a device, particularly a semiconductor or other electronics device, and may, for example, be a base substrate structure, such as a semiconductor wafer or a layer on or overlying a base substrate structure such as a thin film. The workpiece may be a conventional silicon workpiece or other bulk workpiece comprising a layer of semi-conductive material. As used herein, the term "bulk workpiece" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The workpiece may be doped or undoped. Thus, the workpiece is not intended to be limited to any particular base structure, underlying layer or overlying layer, patterned or un-patterned, but rather, is contemplated to include any such layer or base structure, and any combination of layers and/or base structures. The description below may reference particular types of workpieces, but this is for illustrative purposes only and not limitation.

As noted above, advanced methodologies are required to address the challenges and meet the demands for aggressive patterning at sub 30 nm technology nodes. And, as also noted, these methodologies present their own set of challenges, which manifest as issues with etch selectivity, rate, profile control, etc. The ability to successfully integrate patterning schemes with highly selective etch processes is paramount to robust pattern transfer.

As an example, once the circuit pattern is initially formed, the patterned material, whether it be a photosensitive material patterned using optical lithography, a mechanically imprinted patterned layer, or direct self-assembled layer, among other things, serves as a protective layer that masks some regions of the semiconductor substrate, while other regions are exposed to permit transfer of the circuit pattern to an underlying layer utilizing a dry etching process, such as a plasma etch process. In order to increase mask budget and implement multi-patterning techniques, multi-layer mask schemes can be implemented, including bi-layer masks or tri-layer masks.

As previously noted, advanced patterning schemes utilize multi-layer masks of various compositions. Such multi-layer masks include crystalline and amorphous silicon, amorphous carbon, silicon oxide ($SiO_x$), silicon nitride ($SiN_y$), silicon oxynitride ($SiO_xN_y$), silicon-containing anti-reflective coating (SiARC), among others. Depending on the process flow and patterning scheme, subsequent etch steps can be used to etch or remove one material relative to another. For example, it may be desirable to selectively remove SiARC or silicon oxynitride ($SiO_xN_y$) with respect to other materials/films, such as organic dielectric layers (ODL), crystalline and amorphous silicon, amorphous carbon, silicon dioxide ($SiO_x$), silicon nitride ($SiN_y$).

Figure 1B:
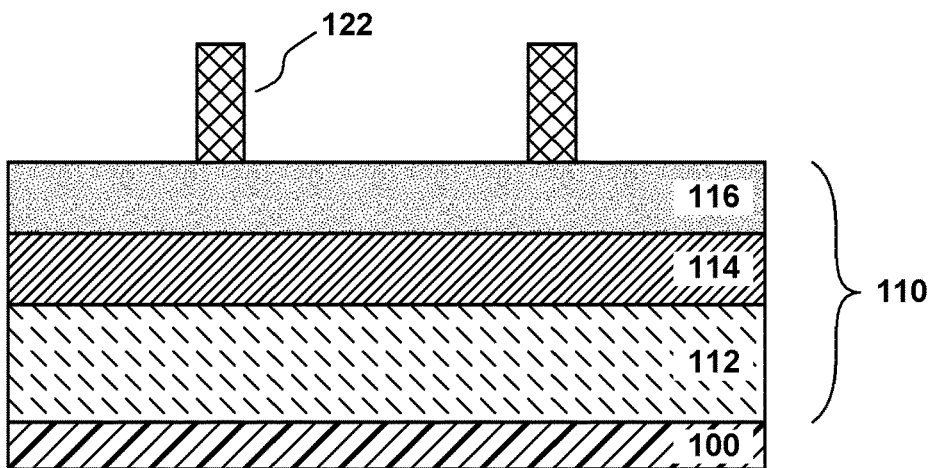
Figure 2:
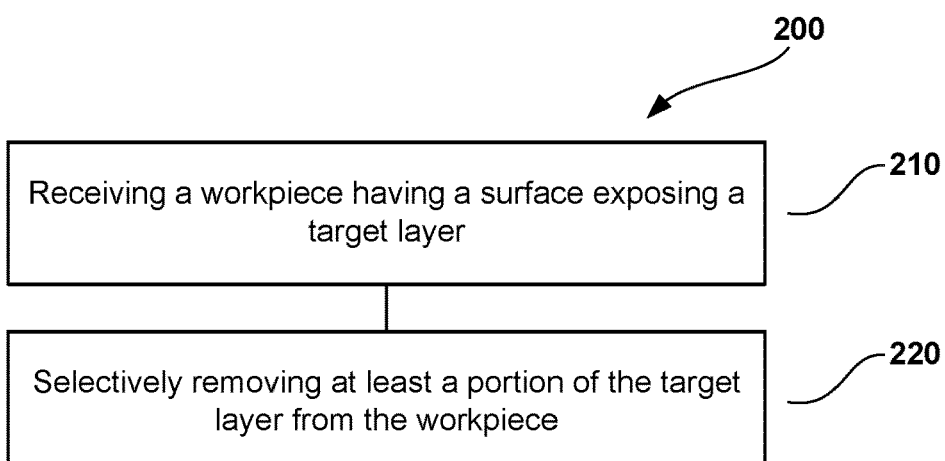
FIG. 2 provides a flow chart illustrating a method of dry removing a layer on a substrate according to an embodiment.

Referring now to the drawings, wherein like reference numerals designate identical or corresponding parts throughout the several views, FIGS. 1A, 1B, and 2 illustrate a method for the dry removal of a material on a microelectronic workpiece according to an embodiment. The method is pictorially illustrated in FIGS. 1A and 1B, and presented by way of a flow chart 200 in FIG. 2. As presented in FIG. 2, the flow chart 200 begins in 210 with receiving a workpiece 100 having a surface exposing a target layer to be at least partially removed.

As shown in FIG. 1A, the workpiece 100 can include a patterned mask 120 overlying a film stack 110, including one or more layers 112, 114, 116 to be etched or patterned. The patterned mask 120 can define an open feature pattern overlying one or more additional layers. The workpiece 100 further includes device layers. The device layers can include any thin film or structure on the workpiece into which a pattern is to be transferred. Furthermore, the patterned mask 120 can include a patterned layer 122, and a target layer 124 to be removed.

The workpiece 100 can include a bulk silicon substrate, a single crystal silicon (doped or un-doped) substrate, a semiconductor-on-insulator (SOI) substrate, or any other semiconductor substrate containing, for example, Si, SiC, SiGe, SiGeC, Ge, GaAs, InAs, InP, as well as other III/V or II/VI compound semiconductors, or any combination thereof (Groups II, III, V, VI refer to the classical or old IUPAC notation in the Periodic Table of Elements; according to the revised or new IUPAC notation, these Groups would refer to Groups 2, 13, 15, 16, respectively). The workpiece 100 can be of any size, for example, a 200 mm (millimeter) substrate, a 300 mm substrate, a 450 mm substrate, or an even larger substrate. The device layers can include any film or device structure into which a pattern can be transferred.

In 220, at least a portion of the target layer 124 is selectively removed from the workpiece 100. For example, the target layer 124 can be selectively removed relative to the patterned layer 122 and layer 116 of film stack 110. The selective removal can be performed by placing the workpiece 100 in a single chamber, dry, non-plasma etch system, such as the system to be described in FIG. 3 or the system described in U.S. Pat. No. 7,718,032, entitled "Dry non-plasma treatment system and method of using", or a tandem chamber, dry, non-plasma etch system, such as the system described in U.S. Pat. No. 7,029,536, entitled "Processing system and method for treating a substrate" or U.S. Pat. No. 8,303,716, entitled "High throughput processing system for chemical treatment and thermal treatment and method of operating"; the entire contents of which are herein incorporated by reference.

According to one embodiment, the selective removal is performed by exposing the surface of the workpiece to a chemical environment containing N, H, and F at a first setpoint temperature to chemically alter a surface region of the target layer, and then, elevating the temperature of the workpiece to a second setpoint temperature to remove the chemically treated surface region of the target layer. The target layer 124 can include a layer composed of silicon and either (1) organic material or (2) both oxygen and nitrogen.

For example, the target layer 124 can include silicon oxynitride ($SiO_xN_y$), wherein x and y are real numbers greater than zero. Furthermore, the target layer 124 can include a silicon-containing anti-reflective coating (ARC) layer. The target layer can have a silicon content less than or equal to 20% by weight. Alternatively, the target layer can have a silicon content greater than 20% by weight. Alternatively yet, the target layer can have a silicon content in excess of 40% by weight. As an example, the target layer 124 can include a silicon-containing anti-reflective coating (ARC) having a silicon content approximately equal to 17% by weight. As another example, the target layer 124 can include a silicon-containing anti-reflective coating (ARC) having a silicon content approximately equal to 43% by weight.

During the exposing, select surfaces of the workpiece, including exposed surfaces of the target layer 124, are chemically treated by the gas-phase chemical environment. The inventors have observed the chemical alteration of these surface layers to proceed in a self-limiting manner, i.e., the surface is exposed to the chemical environment for a pre-determined amount of time, and the chemical alteration proceeds to a self-limiting depth. A specific material can be targeted and a pre-determined depth can be achieved by selecting various process parameters, including the processing pressure for the chemical environment, the temperature of the workpiece, the temperature of the workpiece holder, the temperature of other chamber components, the composition of the chemical environment, and the absolute and relative flow rates of the gas-phase constituents into the chamber. Upon elevation of the temperature of the workpiece, the chemically altered region of select surfaces of the target layer 124 is volatilized and removed.

As described above the temperature of the workpiece holder, or workpiece, can be selected to selectively remove one material relative to another. In one example, to selectively remove a layer composed of silicon and organic material, relative to silicon oxide, silicon nitride, crystalline silicon, amorphous silicon, amorphous carbon, and organic materials, the first setpoint temperature of the workpiece holder, or workpiece, can range from 50 degrees C. to 100 degrees C., or 60 degrees C. to 90 degrees C., or preferably from 70 degrees C. to 90 degrees C. In another example, to selectively remove a layer composed of silicon and both oxygen and nitrogen (e.g., $SiO_xN_y$, x and y being real numbers greater than zero), relative to silicon oxide, silicon nitride, crystalline silicon, amorphous silicon, amorphous carbon, and organic materials, the first setpoint temperature of the workpiece holder, or workpiece, can range from 35 degrees C. to 100 degrees C., or preferably from 40 degrees C. to 100 degrees C. (it can depend on the stack of materials being exposed). In yet another example, to selectively remove a layer composed of $SiO_x$, wherein x is a real number greater than zero, the first setpoint temperature can range from 10 degrees C. to 40 degrees C.

The chemical environment can contain HF, $NF_3$, $F_2$, $NH_3$, $N_2$, or $H_2$, or a combination of two or more thereof. The chemical environment can further contain a noble element. In other embodiments, the chemical environment can contain an excited specie, a radical specie, or a metastable specie, or any combination of two or more thereof. For example, the dry, non-plasma etch chamber includes a remote plasma generator or remote radical generator arranged to supply the dry, non-plasma etch chamber with excited, radical or metastable specie of F, N, or H. The processing pressure can range from 500 mTorr to 2 Torr.

Thereafter, the targeted chemically altered surface layers are desorbed by elevating the temperature from the first setpoint temperature to the second setpoint temperature, which may take place in the same chamber or a separate chamber. The second setpoint temperature can range from 100 degrees C. to 225 degrees C., or preferably, the second setpoint temperature ranges from 160 degrees C. to 190 degrees C.

In one example, the inventors have demonstrated the selective removal of a target layer composed of a $SiO_xN_y$, x and y being real numbers greater than zero, wherein an etch selectivity of the target layer relative to silicon oxide, silicon nitride, crystalline silicon, amorphous silicon, amorphous carbon, and organic materials exceeded unity. $SiO_xN_y$ can be completely removed with little to no pattern lift-off or damage, and Si substrate loss. As an example, three (3), ten (10) second cycles at a first setpoint temperature of 85 degrees C., and a second setpoint temperature of 100 degrees C. has achieved the above identified results.

In another example, the inventors have demonstrated the selective removal of a target layer composed of a silicon-containing anti-reflective coating (ARC) having a silicon content approximately equal to 17% by weight, or approximately equal to 43% by weight, wherein an etch selectivity of the target layer relative to silicon oxide, silicon nitride, crystalline silicon, amorphous silicon, amorphous carbon, and organic materials exceeded 10-to-1. SiARC can be completely removed with little to no pattern lift-off or damage, little to no pattern "wiggle", and Si substrate loss.

Furthermore, the steps of exposing and elevating can be alternatingly and sequentially performed. From one step to the next, or one cycle to the next, any one or more of the process parameters, including the processing pressure for the chemical environment, the temperature of the workpiece, the temperature of the workpiece holder, the temperature of other chamber components, the composition of the chemical environment, and the absolute and relative flow rates of the gas-phase constituents into the chamber, can be adjusted.

Figure 3:
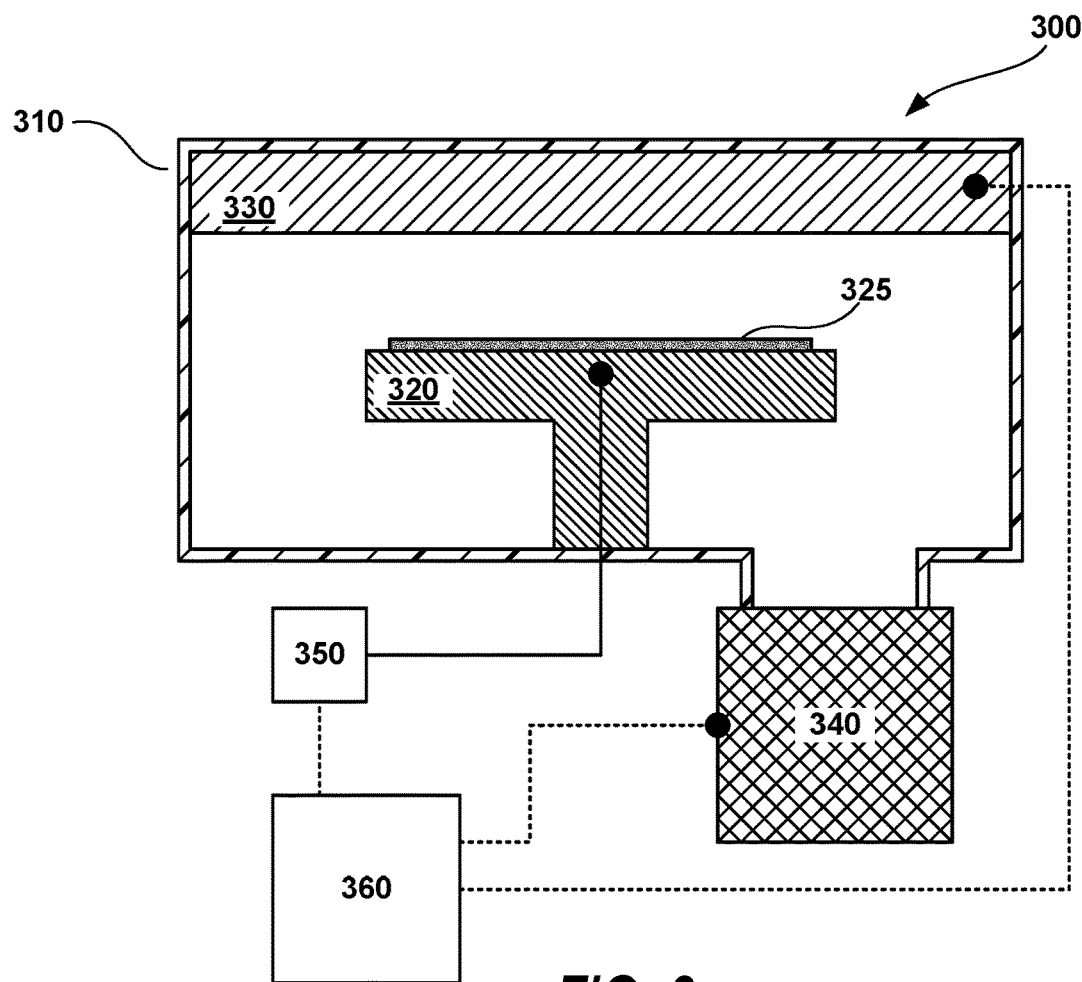
FIG. 3 provides a schematic illustration of a dry, non-plasma etching system according to an embodiment.

According to another embodiment, the workpiece 100 is placed on a workpiece holder in a single chamber, dry, non-plasma etch system, such as the system described in FIG. 3. The single chamber, dry, non-plasma etch system is operated to perform the following: (1) exposing the surface of the workpiece to a chemical environment at a first setpoint temperature in the range of 35 degrees C. to 100 degrees C. to chemically alter a surface region of the target layer, and (2) then, elevating the temperature of the workpiece to a second setpoint temperature at or above 100 degrees C. to remove the chemically treated surface region of the target layer. The first setpoint temperature can range from 35 degrees C. to 100 degrees C., or 70 degrees C. to 90 degrees C., and the second setpoint temperature can range from 110 degrees C. to 225 degrees C.

The first setpoint temperature can be established by flowing a heat transfer fluid through the workpiece holder at a first fluid setpoint temperature. The second setpoint temperature can be established by flowing the heat transfer fluid through the workpiece holder at a second fluid setpoint temperature. In addition to flowing the heat transfer fluid through the workpiece holder at the second fluid setpoint temperature, the workpiece holder can be heated by coupling electrical power to at least one resistive heating element embedded within the workpiece holder. Alternatively, in addition to flowing the heat transfer fluid through the workpiece holder at the second fluid setpoint temperature, heating the workpiece holder using at least one other heat source separate from the workpiece holder.

According to another embodiment, a system 300 for the dry removal of a material on a microelectronic workpiece 325 is shown in FIG. 3. The system 300 includes a process chamber 310 for processing workpiece 325 in a non-plasma, vacuum environment, a workpiece holder 320 arranged within the process chamber 310, and configured to support the workpiece 325, a temperature control system 350 coupled to the workpiece holder 320, and configured to control the temperature of the workpiece holder 320 at two or more setpoint temperatures, a gas distribution system 330 coupled to the process chamber 310, and arranged to supply one or more process gases into the process chamber 310, and a controller 360 operably coupled to the temperature control system 350, and configured to control the temperature of the workpiece holder 320 ranging from 35 degrees C. to 250 degrees C. For example, the temperature control system 350 can be configured to control the temperature of the workpiece holder 320 at a first setpoint temperature in the range of 35 degrees C. to 100 degrees C., and adjust and control the temperature of the workpiece holder 320 at a second setpoint temperature at or above 100 degrees C. Alternatively, for example, the temperature control system 350 can be configured to control the temperature of the workpiece holder 320 at a first setpoint temperature in the range of 10 degrees C. to 100 degrees C., and adjust and control the temperature of the workpiece holder 320 at a second setpoint temperature at or above 100 degrees C.

The process chamber 310 can include a vacuum pump 340 to evacuate process gases from process chamber 310. The process chamber 310 can further include a remote plasma generator or remote radical generator arranged to supply the process chamber with excited, radical or metastable species, or combinations thereof.

Gas distribution system 330 can include a showerhead gas injection system having a gas distribution assembly, and one or more gas distribution plates or conduits coupled to the gas distribution assembly and configured to form one or more gas distribution plenums or supply lines. Although not shown, the one or more gas distribution plenums may comprise one or more gas distribution baffle plates. The one or more gas distribution plates further comprise one or more gas distribution orifices to distribute a process gas from the one or more gas distribution plenums to the process chamber 310. Additionally, one or more gas supply lines may be coupled to the one or more gas distribution plenums through, for example, the gas distribution assembly in order to supply a process gas comprising one or more gases. Process gases can be introduced together as a single flow, or independently as separate flows.

Gas distribution system 330 can further include a branching gas distribution network designed to reduce or minimize gas distribution volume. The branching network can remove plenums, or minimize the volume of gas plenums, and shorten the gas distribution length from gas valve to process chamber, while effectively distributing the process gas across the diameter of the workpiece 325. In doing so, gases can be switched more rapidly, and the composition of the chemical environment can be changed more effectively.

The volume of the process chamber 310 defining the chemical environment, to which the workpiece 325 is exposed, can be reduced or minimized in order to reduce or minimize the residence time or time required to evacuate, displace, and replace one chemical environment with another chemical environment. The time to displace the chemical environment in the process chamber 310 can be estimated as the ratio of the process chamber volume to the pumping speed delivered to the process chamber volume by the vacuum pump 340.

Workpiece holder 320 can provide several operational functions for thermally controlling and processing workpiece 325. The workpiece holder 320 includes one or more temperature control elements configured to adjust and/or elevate a temperature of the workpiece holder 320.

Figure 4:
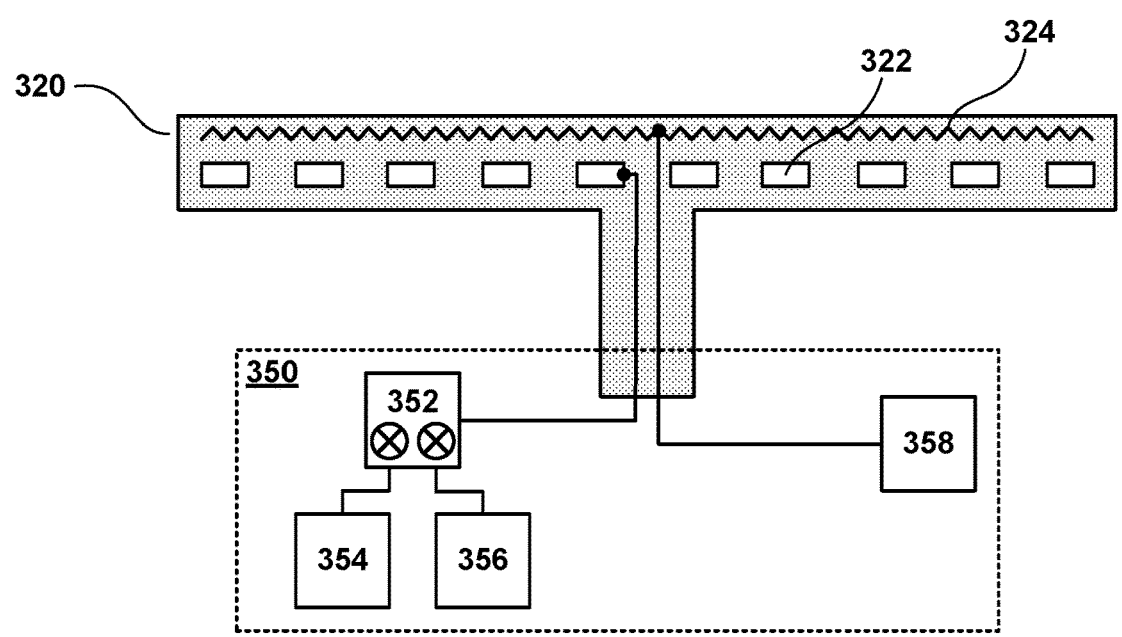
FIG. 4 provides a schematic illustration of a workpiece holder according to an embodiment.

As shown in FIG. 4, workpiece holder 320 can include at least one fluid channel 322 to allow flow of a heat transfer fluid there through and alter a temperature of the workpiece holder 320. Workpiece holder 320 can further include at least one resistive heating element 324. Multi-zone channels and/or heating elements can be used to adjust and control the spatial uniformity of heating and cooling of workpiece 325. For example, the at least one resistive heating element 324 can include a central-zone heating element and an edge-zone heating element. Additionally, for example, the at least one fluid channel 322 can include a central-zone fluid channel and an edge-zone fluid channel. At temperatures above 200 to 250 degrees C., other heating systems can be used, including infrared (IR) heating, such as lamp heating, etc.

A power source 358 is coupled to the at least one resistive heating element 324 to supply electrical current. The power source 358 can include a direct current (DC) power source or an alternating current (AC) power source. Furthermore, the at least one resistive heating element 324 can be connected in series or connected in parallel.

The at least one resistive heating element 324 can, for example, include a resistive heater element fabricated from carbon, tungsten, nickel-chromium alloy, aluminum-iron alloy, aluminum nitride, etc. Examples of commercially available materials to fabricate resistive heating elements include Kanthal, Nikrothal, Akrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe). According to one example, each of the at least one resistive heating element 324 can include a heating element, commercially available from Watlow Electric Manufacturing Company (12001 Lackland Road, St. Louis, Mo. 63146). Alternatively, or in addition, cooling elements can be employed in any of the embodiments.

A heat transfer fluid distribution manifold 352 is arranged to pump and monitor the flow of heat transfer fluid through the one or more fluid channels 322. The heat transfer fluid distribution manifold 352 can draw heat transfer fluid from a first heat transfer fluid supply bath 354 at a first heat transfer fluid temperature and/or a second heat transfer fluid supply bath 356 at a second heat transfer fluid temperature. Manifold 352 can mix heat transfer fluid from the first and second heat transfer fluid supply baths 354, 356 to achieve an intermediate temperature. Furthermore, the heat transfer fluid distribution manifold 352 can include a pump, a valve assembly, a heater, a cooler, and a fluid temperature sensor to controllably supply, distribute, and mix a heat transfer fluid at a predetermined temperature.

In an alternative embodiment, the temperature control system 350 can include a hot wall in close proximity to the work piece holder 320. The workpiece holder 320 can further include a workpiece clamping system configured to clamp the workpiece to the workpiece holder, and a backside gas supply system configured to supply a heat transfer gas to the backside of the workpiece.

The heat transfer fluid can include a high temperature fluid having a boiling point exceeding 200 degrees C. For example, the heat transfer fluid can include Fluorinert™ FC40 (having a temperature range of −57 to 165 degrees C.), or Fluorinert™ FC70 (having a temperature range of −25 to 215 degrees C.), commercially available from 3M.

Workpiece holder 320 can be monitored using a temperature sensing device, such as a thermocouple (e.g. a K-type thermocouple, Pt sensor, etc.) or optical device. Furthermore, the substrate holder temperature control system 350 may utilize the temperature measurement as feedback to the workpiece holder 320 in order to control the temperature of workpiece holder 320. For example, at least one of a fluid flow rate, a fluid temperature, a heat transfer fluid type, a heat transfer fluid pressure, a clamping force, a resistive heater element current or voltage, a thermoelectric device current or polarity, etc. may be adjusted in order to affect a change in the temperature of workpiece holder 320 and/or the temperature of the workpiece 325.

As noted above, controller 360 is operably coupled to the temperature control system 350, and configured to control the temperature of various components in system 300, including the workpiece holder 320, at temperatures ranging from 10 degrees C. to 250 degrees C., or 35 degrees C. to 250 degrees C., or 50 degrees C. to 250 degrees C. For example, under instruction of controller 360, the temperature control system 350 can be configured to control the temperature of the workpiece holder 320 at a first setpoint temperature in the range of 35 degrees C. to 100 degrees C., and adjust and control the temperature of the workpiece holder 320 at a second setpoint temperature at or above 100 degrees C. (see process recipes described above). The temperature control system 350 can obtain temperature information from one or more temperature sensors arranged to measure the temperature of the workpiece holder 320, the workpiece 325, the chamber wall of the process chamber 310, or the temperature of the gas distribution system 330, among others, and utilize the temperature information to controllably adjust these temperatures.

As an example, when changing the temperature of the workpiece holder 320 from the first setpoint temperature, in the range of 35 degrees C. to 100 degrees C., to the second setpoint temperature, at or above 100 degrees C., the fluid temperature of the heat transfer fluid can be adjusted rapidly by changing the ratio of heat transfer fluid drawn from the heat transfer fluid supply baths 354, 356. Once within a predetermined range of the targeted second setpoint temperature, the at least one resistive heating element can be utilized to accurately control the setpoint temperature. The workpiece holder 320 can be designed to have a relatively low thermal mass. For example, the thickness of the holder and material composition of the holder can be designed to reduce or minimize the thermal mass of the holder. Furthermore, the at least one fluid channel 322, including the fluid conduits supplying heat transfer fluid to the at least one fluid channel 322, can be designed to have low volume in order to change fluid temperature rapidly. For example, the length and diameter of the fluid channels and conduits can be designed to reduce or minimize volume (i.e., reduce the time necessary to displace fluid of one temperature, and replace it with fluid of another temperature).

Other chamber components of process chamber 310, including chamber walls, the gas distribution system 330, etc., can include heating and/or cooling elements to control the temperature thereof. For example, the chamber wall temperature of the process chamber 310 and the temperature of at least a portion of the gas distribution system can be controlled to a temperature up to 150 degrees C., or within the range 50 degrees C. to 150 degrees C. (preferably, 70 degrees C. to 110 degrees C.).

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method for the dry removal of a material on a microelectronic workpiece, comprising:
   receiving a workpiece having a multi-layer mask that includes: (i) a patterned layer and (ii) a surface exposing a target layer composed of silicon and either (1) organic material or (2) both oxygen and nitrogen;
   placing the workpiece in a processing chamber consisting of a dry, non-plasma etch chamber and locating the workpiece on a workpiece holder; and
   operating the dry, non-plasma etch chamber to selectively remove at least a portion of the target layer from the workpiece by performing the following:
      exposing the surface of the workpiece to a chemical environment containing a gaseous mixture that includes N, H, and F at a first workpiece setpoint temperature to chemically alter a surface region of the target layer and to chemically alter a depth within the target layer such that, after the exposing, the target layer includes a chemically altered surface region and a chemically altered depth within the target layer; wherein the N, H, and F are introduced to the dry, non-plasma etch chamber simultaneously,
      establishing the surface of the workpiece at the first workpiece setpoint temperature by flowing a heat transfer fluid through the workpiece holder at a first fluid setpoint temperature;
      monitoring, by a temperature sensing device, a temperature of the workpiece holder; and after establishing the surface of the workpiece at the first workpiece setpoint temperature, elevating the temperature of the workpiece to a second workpiece setpoint temperature by adjusting a flow rate of the heat transfer fluid flowing through the workpiece holder based on the monitored temperature of the workpiece holder by the temperature sensing device, wherein prior to elevating the temperature of the workpiece to the second workpiece setpoint temperature, the target layer includes the chemically altered surface region and the chemically altered depth within the target layer;

wherein the selectively removing of at least a portion of the target layer is performed selectively relative to silicon oxide, silicon nitride, crystalline silicon, amorphous silicon, amorphous carbon, and organic materials; and wherein the target layer comprises $SiO_xN_y$, x and y being real numbers greater than zero, and wherein an etch selectivity of the target layer relative to silicon oxide, silicon nitride, crystalline silicon, amorphous silicon, amorphous carbon, and organic materials exceeds unity.

2. The method of claim 1, wherein the target layer has a silicon content less than or equal to 20% by weight.

3. The method of claim 1, wherein the target layer has a silicon content greater than 20% by weight.

4. The method of claim 1, wherein the target layer has a silicon content in excess of 40% by weight.

5. The method of claim 1, wherein the first workpiece setpoint temperature is less than 100 degrees C., and the second workpiece setpoint temperature is greater than 100 degrees C.

6. The method of claim 1, wherein the first workpiece setpoint temperature ranges from 60 degrees C. to 90 degrees C., and the second workpiece setpoint temperature ranges from 100 degrees C. to 225 degrees C.

7. The method of claim 1, wherein the first workpiece setpoint temperature ranges from 35 degrees C. to 100 degrees C., and the second workpiece setpoint temperature ranges from 100 degrees C. to 225 degrees C.

8. The method of claim 1, wherein the steps of exposing and elevating are performed at a processing pressure ranging from 500 mTorr to 2 Torr.

9. The method of claim 1, wherein the steps of exposing, establishing, monitoring, and elevating are alternatingly and sequentially performed.

10. The method of claim 1, wherein the chemical environment contains a combination of two or more of HF, $NF_3$, $F_2$, $NH_3$, $N_2$, or $H_2$.

11. The method of claim 10, wherein the chemical environment further contains a noble element.

12. The method of claim 1, wherein the chemical environment contains an excited specie, a radical specie, or a metastable specie, or any combination of two or more thereof.

13. The method of claim 1, wherein the dry, non-plasma etch chamber includes a remote radical generator arranged to supply the dry, non-plasma etch chamber with excited, radical or metastable specie of F, N, and H.

14. The method of claim 1, further comprising:
changing the first fluid setpoint temperature to a second fluid setpoint temperature; and
flowing the heat transfer fluid at the second fluid setpoint temperature through the workpiece holder.

15. The method of claim 14, further comprising:
while flowing the heat transfer fluid at the second fluid setpoint temperature, heating the workpiece by coupling power to one or more resistive heating elements embedded within the workpiece holder.

16. The method of claim 1, wherein the steps of exposing, establishing, monitoring, and elevating are repeated sequentially two or more times so that the target layer is completely removed from the workpiece without removing the patterned layer.

17. A method for the dry removal of a material on a microelectronic workpiece, comprising:
receiving a workpiece having a multi-layer mask that includes: (i) a patterned layer and (ii) a surface exposing a target layer composed of silicon and either (1) organic material or (2) both oxygen and nitrogen;
placing the workpiece in a processing chamber consisting of a dry, non-plasma etch chamber and locating the workpiece on a workpiece holder; and
operating; the dry, non-plasma etch chamber to selectively remove at least a portion of the target layer from the workpiece by performing the following:
exposing the surface of the workpiece to a chemical environment containing a gaseous mixture that includes N, H, and F at a first workpiece setpoint temperature to chemically alter a surface region of the target layer and to chemically alter a depth within the target layer such that, after the exposing, the target layer includes a chemically altered surface region and a chemically altered depth within the target layer, wherein the N, H, and F are introduced to the dry, non-plasma etch chamber simultaneously,
establishing the surface of the workpiece at the first workpiece setpoint temperature by flowing a heat transfer fluid through the workpiece holder at a first fluid setpoint temperature;
monitoring by a temperature sensing device, a temperature of the workpiece holder; and
after establishing the surface of the workpiece at the first workpiece setpoint temperature, elevating the temperature of the workpiece to a second workpiece setpoint temperature by adjusting a flow rate of the heat transfer fluid flowing through the workpiece holder based on the monitored temperature of the workpiece holder by the temperature sensing device, wherein prior to elevating the temperature of the workpiece to the second workpiece setpoint temperature, the target layer includes the chemically altered surface region and the chemically altered depth within the target layer;
wherein the target layer comprises a sill con-containing anti-reflective coating (ARC) having a silicon content approximately equal to 17% by weight, or approximately equal to 43% by weight, and wherein an etch selectivity of the target layer relative to silicon oxide, silicon nitride, crystalline silicon, amorphous silicon, amorphous carbon, and organic materials exceeds 10-to-1.

* * * * *

UNITED STATES PATENT AND TRADEMARK OFFICE
CERTIFICATE OF CORRECTION

PATENT NO. : 10,971,372 B2
APPLICATION NO. : 15/191956
DATED : April 6, 2021
INVENTOR(S) : Subhadeep Kal et al.

Page 1 of 1

It is certified that error appears in the above-identified patent and that said Letters Patent is hereby corrected as shown below:

On the Title Page

Page 2, item [56], "CN 101205312" should be -- CN 102105312 --.

In the Claims

Column 12, Claim 17, Line 40, "monitoring by" should be -- monitoring, by --.

Column 12, Claim 17, Line 54, "sill con-containing" should be -- silicon-containing --.

Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*